United States Patent [19]

Kane et al.

[11] Patent Number: 5,252,857
[45] Date of Patent: Oct. 12, 1993

[54] STACKED DCA MEMORY CHIPS

[75] Inventors: Milburn H. Kane, Austin; John G. Roby, Cedar Park; Gustav Schrottke, Austin, all of Tex.

[73] Assignee: International Business Machines Corporation, Armonk, N.Y.

[21] Appl. No.: 740,344

[22] Filed: Aug. 5, 1991

[51] Int. Cl.⁵ .................. H01L 23/02; H01L 23/12
[52] U.S. Cl. ........................ 257/686; 257/692; 257/724; 439/69; 439/74; 371/8.1; 371/10.1; 371/11.1; 361/749; 361/772
[58] Field of Search ............ 357/74, 75; 439/69, 439/74; 257/686, 692, 723, 724; 361/398, 400, 404, 412; 371/8.1, 10.1, 11.1

[56] References Cited

U.S. PATENT DOCUMENTS

| | | | |
|---|---|---|---|
| 3,984,860 | 10/1976 | Logue | 357/68 |
| 4,371,912 | 2/1983 | Guzik | 357/75 |
| 4,636,918 | 1/1987 | Jodoin | 357/75 |
| 4,763,188 | 8/1988 | Johnson | 357/74 |
| 4,949,224 | 8/1990 | Yamamura et al. | 361/412 |
| 4,967,950 | 11/1990 | Legg et al. | 228/180.2 |
| 4,991,000 | 2/1991 | Bone et al. | 357/75 |
| 4,992,850 | 2/1991 | Corbett et al. | 357/72 |
| 5,025,306 | 6/1991 | Johnson et al. | 357/75 |
| 5,051,994 | 9/1991 | Bluethman et al. | 371/11.1 |
| 5,061,990 | 10/1991 | Arakawa et al. | 357/80 |
| 5,103,247 | 4/1992 | Sugano et al. | 357/75 |

FOREIGN PATENT DOCUMENTS

| | | | |
|---|---|---|---|
| 0340527 | 4/1989 | European Pat. Off. | |
| 0434543 | 12/1990 | European Pat. Off. | |
| 0033992 | 2/1989 | Japan | 439/74 |
| 0309271 | 12/1989 | Japan | 439/69 |
| 0105595 | 4/1990 | Japan | 439/69 |
| 2237691 | 5/1991 | United Kingdom | 439/74 |

OTHER PUBLICATIONS

K. J. Roche, 'Wrap Around C-Clip' IBM Tech. Disclosure Bulletin, vol. 5 No. 11, Apr. 1963, p. 14.
Patent abstract of Japan, vol. 13, No. (E-785) (3649) Jul. 1989, & JP-A-10 80 032 (Hitachi) Mar. 24, 1989, abstract.

*Primary Examiner*—Rolf Hille
*Assistant Examiner*—David Ostrowski
*Attorney, Agent, or Firm*—Andrea P. Bryant; Mark E. McBurney

[57] ABSTRACT

A memory system package is provided by placing memory chips face-to-face using as an interposer a thin flexible carrier having through-carrier-connections, vias, for common memory chip I/O pads which are brought out to access external signals, either control, I/O or power. These external signals may also be wired to memory chip pads that are not common.

4 Claims, 2 Drawing Sheets

STACKED DCA MEMORY CHIPS

TECHNICAL FIELD

This invention relates to electronic packaging. More specifically it relates to packaging multiple memory chips face-to-face using a thin carrier with through-carrier-connections (vias) as an interposer.

DESCRIPTION OF THE PRIOR ART

It is desirable to package electronic devices as densely as possible. Further it is especially desirable to be able to package a memory system as compactly as possible. As processors and system controllers shrink in size the memory has become one of the dominant factors in establishing the amount of real estate required to package a product. The size of the system memory package must shrink to keep pace with the rest of the system components.

The use of direct chip attach (DCA) techniques is advantageous for memory system packaging. Packaging density is maximized because of the elimination of space requirements associated with chip encapsulation and with peripherally extending leads. DCA technology also allows denser packaging since there is reduced clearance necessary for accommodating chip/package placement apparatus.

When chips are placed in extremely close proximity, wiring may be reduced—with an accompanying reduction in parasitic capacitances and lead inductance and system performance is enhanced.

Another conventional phenomenon in memory system packaging is to use some combination of partially good memory chips to realize a total, desired capacity. Many such techniques are known in the art, for example, as described in commonly assigned, allowed U.S. application Ser. No. 07/345,323 now U.S. Pat. No. 5,051,994. It is known, for example, to stack or parallel complementary partially good devices.

Thus, it can be seen that stacking either partially or all good memory chips utilizing DCA technology is desirable for maximizing memory system packaging density and minimizing waste due to defective chips.

Dense memory packaging is becoming a requirement in all classes of products, notably in the smaller machines such as laptop, scratchpad and notebook computers where space is a premium. There is a similar requirement for large products such as supercomputers and mainframes due to the fact that memory system performance is enhanced by closely packaging memory devices.

SUMMARY OF THE INVENTION

This invention permits use of chips mounted directly to a carrier with no first level package. This reduces the wiring necessary to interconnect two chips to that required to interconnect one. Appropriate circuitization on the carrier allows forming good devices using "partial good" chips or more densely packaged all good chips.

The present invention is a technique for achieving maximum density in packaging memory chips, by mounting chips face-to-face on opposite sides of a flexible carrier provided with through connections from which pads may be wired out for access to external signals: control; I/O; and power. These external signals may also be wired, as required, to noncommon pads. The flexible carrier serves as an interposer for either connecting pads from oppositely placed chips or interchanging pads to provide a mirror image. It is necessary to be able to wire out from individual pads that do not match in the mirror position.

In one embodiment, using a pair of defect free memory chips a memory system is achieved with double chip capacity.

In another embodiment, partially good memory chips are used in combination to achieve a predetermined capacity in the memory system package.

BRIEF DESCRIPTION OF THE DRAWING

The above and other features and advantages of the present invention become clear from the following detailed description, taken in conjunction with the accompanying drawing wherein the same reference numerals are used throughout to designate the same parts and wherein:

FIG. 2 is an exploded schematic diagram of two chips mounted face-to-face with carrier in between;

BEST MODE FOR CARRYING OUT THE INVENTION

Figure 1:
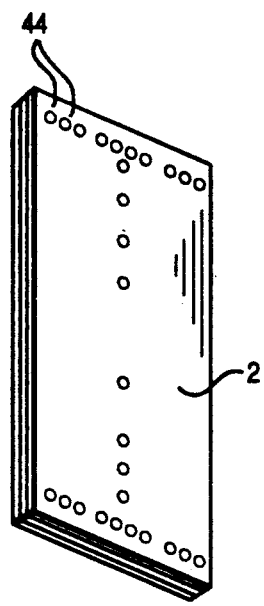
FIG. 1 is a schematic diagram of a chip.

Refer now to FIG. 1 which shows a chip 2 having a plurality of solder bumps 4 arranged in a generally I shaped configuration. Solder bumps 4 may be controlled collapse chip connection (C4) bumps and their footprint is typical of a memory pad pattern. It will be used throughout the instant description.

To best utilize this invention, C4 pads 4 on chips 2 should be functionally mirror images so that pads 4 from chips placed face-to-face will line up in such a configuration.

It is also desirable that the pads of the chips be tied together. While it is true that in general pads on chips are not functionally mirror image, memory chips approach this condition, and the control, power and data lines can be "dotted" together. In instances where it is not possible to have complete functional mirror images a method of wiring those pads that are not in that configuration is described. This will be referred to as interchange wiring.

Figure 2:
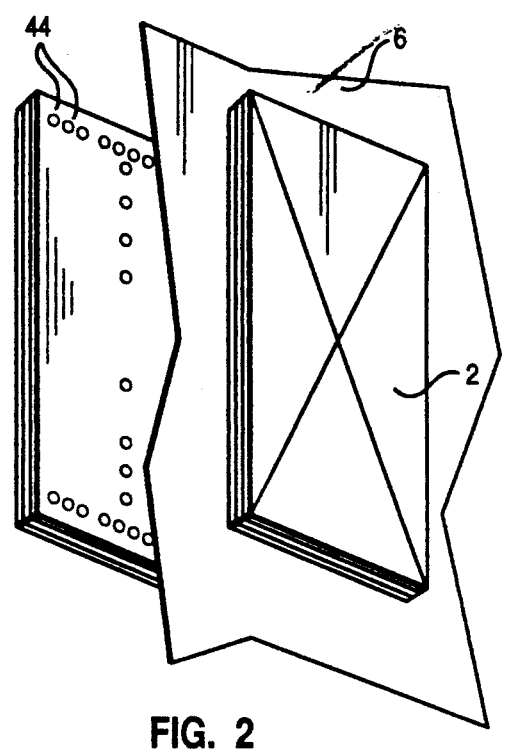

In FIG. 2, a chip 2 is shown on either side of flexible carrier 6. When two chips 2 are placed face-to-face as in FIG. 2, pads 4 from each chip line up with each other. A large percentage of the pads on the chips are common in function and may be wired directly to each other through the material of carrier 6.

Carrier 6 may be of any thickness or material, however, we prefer to use a thin film flexible material, such as polymide having a thickness in the range of 0.5–2.0 mils. Carrier 6 may be circuitized using conventional printed circuit technology.

Figure 3:
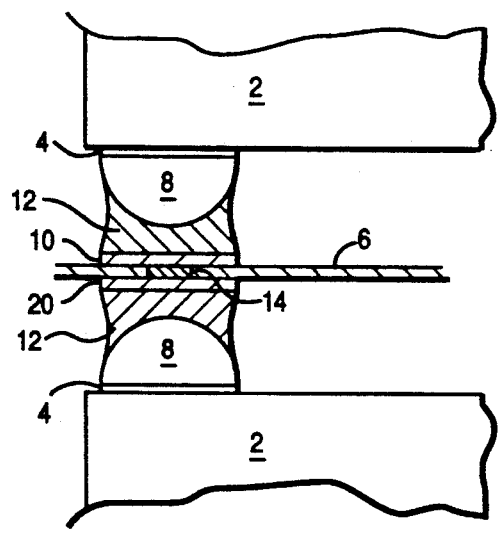
FIG. 3 is a schematic cross section taken along line 3—3 in FIG. 2.

Refer now to FIG. 3. Chip pads 4 have C4 bumps 8, composed typically of solder with a high percentage of lead (90%-97%) with respect to tin (10%-3%). Such a solder bump has a very high melting point, approximately 360 deg. C. Bumps 8 are brought into contact with pads 10 and 20 on the carrier 6, which pads are preferably copper. Pads 10 and 20 are coated with low melting point solder 12, such as eutectic solder with 63% lead and 37% tin, which melts around 183 deg C. Solder 12 should have a thickness in the range of 1-2 mils.

The connection to the chip 2 on the opposite side of carrier 6 is accomplished through carrier via 14. Solid vias may be formed by first providing through holes in carrier 6 and then immersion plating both sides thereof. In our preferred embodiment we use a solid via 14, as opposed to providing a small hole in carrier pads 10 and 20. A solid via 14 simplifies attachment of chips 2 since no solder moves through a via hole from one side of carrier 6 to the other. Connecting chips 2 occurs when the temperature of the assembly shown in FIG. 3 is increased to the desired reflow temperature for solder 12 on carrier 6. If a low temperature system is desired sufficient solder 12 can be applied to pads 10 and 20 to solder the C4 bumps 8 to carrier pads 10 and 20.

Figure 4:
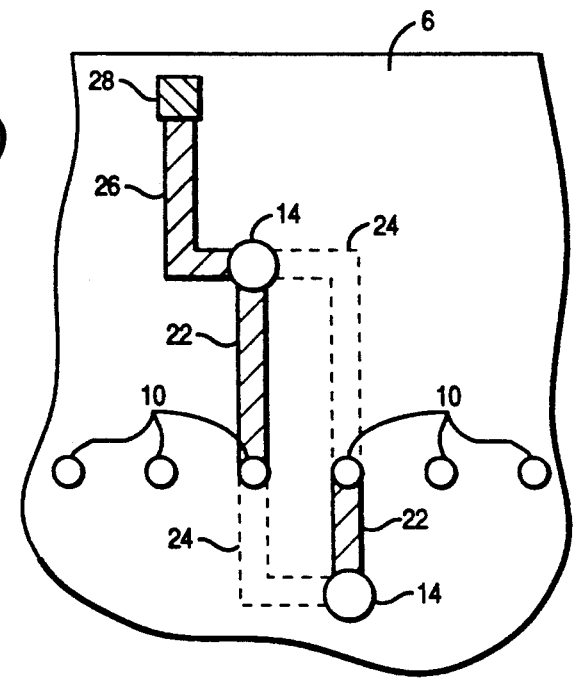
FIG. 4 is a plan view of carrier 6, showing circuitry patterns on opposite sides.
Figure 5:
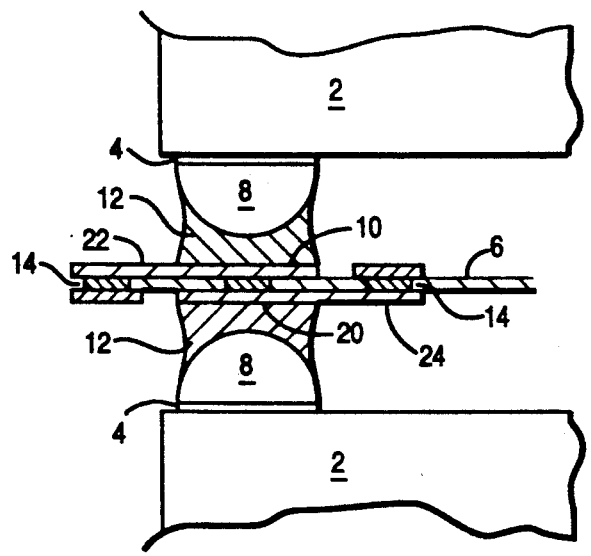
FIG. 5 is a cross sectional view of a chip attachment site on carrier 6 of FIG. 4.

In some instances, chip pads 4 are not to be common when the chips are placed face-to-face. In these situations, we use a method called interchange wiring to connect pads on either side of the carrier to the appropriate pad on the other side. FIGS. 4 and 5 show how this is accomplished.

Referring now to FIG. 4, a portion of carrier 6 shown. Pads 10 and 20 (not shown in FIG. 4) are provided in opposite faces of carrier 6. In FIG. 4, wiring 22 shown as a darkened line on one face of carrier 6 while wiring 24 on the opposite face of carrier 6 is indicated in phantom. Wiring 22 and 24 is provided for interconnecting pads 10, through vias 14 to pads 20 on the opposite face of carrier 6. A copper pad 10 on one surface of carrier 6 is wired to the opposite side through via 14. Via 14 is wired, using wiring 24, to the appropriate pad 20 on the opposite side of carrier 6. A wire 26 is connected from any point in this interchange wiring pattern to an I/O pad of a first level package 28 or to other chips in a package as described above.

With this technique two partial good memory chips may be placed face-to-face, with carrier 6 therebetween, to create an all good first level packaged part.

If carrier 6 is constructed so as to be able to withstand process temperatures in excess of 360 deg C, it is possible to reflow the C4 bump 8 solder but the previously described method is preferred because it simplifies selection of carrier 6 materials. When the temperature of the assembly is raised above the reflow temperature of solder 12, the attachment of bump 8 is complete. Solder from bumps 8 and solder 12 applied to pads 10 on carrier 6 serve as standoff for chips 2. A wire 26 from a pad 10 or 20 to an I/O pad 28 for the package, or to another chip or chip combination might be required. Such a wire may be placed on either face of carrier 6.

FIG. 5 shows in cross-section how a chip 2 may be mounted on interchange wiring circuitry such as described in FIG. 4. Chips 2 with solder bumps 8 are shown connected by solder 12 to pads 10 and 20 on opposites sides of carrier 6. Solid vias 14 connect pads and wiring to an appropriate pad (not shown) on the opposite side of carrier 6 through metal conductors 22 and 24 completing the interconnection.

Figure 6:
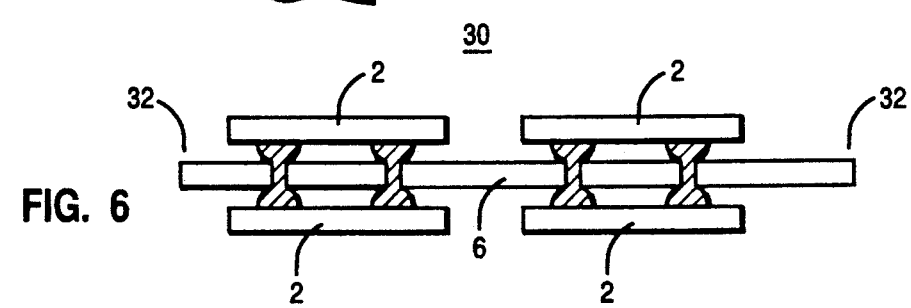
FIG. 6 illustrates attachment of plural pairs of chips on a carrier.

FIG. 6 shows a memory package 30 constructed of a thin flexible carrier 6 with a plurality of pairs, two shown, of chips 2 placed thereon as described above in connection with FIGS. 2 and 3. Edge connection pads 32 are provided along the edges of carrier 6. Carrier 6 may then be folded as appropriate to form an extremely dense memory package.

Figure 7:
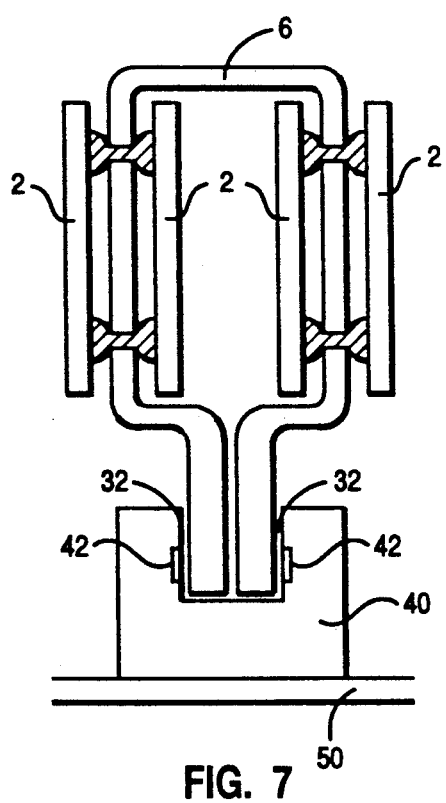
FIG. 7 illustrates a memory package in accordance with the invention mounted in a connector on a circuit board.

FIG. 7 shows how a memory package such as one formed as described in connection with FIG. 6 may be plugged into a connector 40 assembled onto a PCB or backplane 50. Connector 40 includes connection pads 42 for matingly engaging pads 32 (FIG. 6) on carrier 6. Connector 40 is shown schematically. It may be a pin-through-hole device or a surface mount device. Those skilled in the art will understand connector 40 may be assembled to backplane 50 using solder such as eutectic solder with 63% lead, 37% tin. Memory package 30 is then plugged into connector 40 using conventional techniques.

Figure 8:
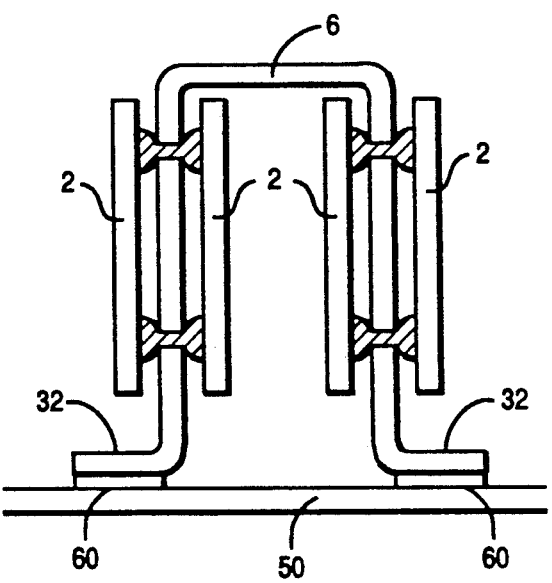
FIG. 8 shows a memory package in accordance with the invention mounted directly to a circuit board.

Refer now to FIG. 8. Another method of connection to the backplane 50 which may be used, comprises soldering I/O pads 32 directly to backplane 50. If it is desired to use batch mounting techniques for memory packages 30, pads 60, typically copper, are provided on backplane 50 in a suitable pattern. Solder is deposited thereon and output tabs 32 of memory package 30 are aligned to pads 60. The temperature of the assembly of FIG. 8 is raised to that required for reflowing the solder used, thereby connecting memory package 30 to backplane 50.

While the present invention has been described having reference to a particular illustrative embodiment, those having skill in the art will appreciate that the above-described and other modifications and minor changes in form and detail may be made without departing from the spirit and scope of the invention as claimed.

We claim:

1. A high density memory package comprising:
   a flexible single layer circuitized carrier;
   plural pairs of identical memory chips having complentarily located defects, each pair having chips disposed on opposite sides of said carrier;
   interconnect circuitry on said carrier adapted for connecting pads on chips within each of said plural pairs of chips, said circuitry connecting said pads independent of their physical location on said chips for making memory capacity of said pair equivalent to a single, defect free memory chip, or two defect free memory chips when no defects are present in said memory chips; and
   edge connectors on said flexible carrier, in electrical contact with said interconnect circuitry memory chip pads, said flexible single layer carrier having said plural pairs of chips mounted thereon being bent into a configuration for bringing said edge connectors into position for assembly to a backplane.

2. The memory package of claim 1 wherein said edge connectors are assembled directly to a backplane surface.

3. The memory package of claim 1 wherein said edge connectors are inserted into a connector assembled to a backplane.

4. The memory packages of claim 1 wherein said memory chips are provided with controlled collapse chip connection solder bumps on their I/O pads.

* * * * *